United States Patent [19]

Carson et al.

[11] Patent Number: 4,806,761

[45] Date of Patent: Feb. 21, 1989

[54] THERMAL IMAGER INCORPORATING ELECTRONICS MODULE HAVING FOCAL PLANE SENSOR MOSAIC

[75] Inventors: John C. Carson, Corona del Mar; Stewart A. Clark, Irvine, both of Calif.

[73] Assignee: Irvine Sensors Corporation, Costa Mesa, Calif.

[21] Appl. No.: 23,644

[22] Filed: Mar. 9, 1987

Related U.S. Application Data

[63] Continuation-in-part of Ser. No. 721,040, Apr. 8, 1985, abandoned.

[51] Int. Cl.[4] .............................................. H01L 31/04
[52] U.S. Cl. .................................... 250/332; 250/334; 250/352
[58] Field of Search ................... 250/332, 370 G, 334, 250/351, 352

[56] References Cited

U.S. PATENT DOCUMENTS

| | | | |
|---|---|---|---|
| 3,808,435 | 4/1974 | Bate et al. | 250/332 |
| 3,869,212 | 3/1975 | Barcher et al. | 250/332 |
| 3,941,923 | 3/1976 | Wheeler | 250/334 |
| 4,118,733 | 10/1978 | Sarson et al. | 250/332 |
| 4,403,148 | 9/1983 | Coon et al. | 250/332 |
| 4,551,629 | 11/1985 | Carson et al. | 250/578 |
| 4,555,623 | 11/1985 | Bridgewater et al. | 250/214 A |

OTHER PUBLICATIONS

Carlson et al., "Devel. of a Storing Mosaic Module", SPIE vol. 197 (1974), pp. 2-8.

Primary Examiner—Carolyn E. Fields
Assistant Examiner—Richard Hanig
Attorney, Agent, or Firm—Thomas J. Plante

[57] ABSTRACT

A thermal imaging system is disclosed in which infrared radiation from the viewed scene is transmitted to a two-dimensional detector array carried on the focal plane of an optical/electronics module which has embedded in it amplifying, filtering and multiplexing circuitry utilizing MOSFET transistors. The module is located inside the cooling device. Cooling requirements depend on the alternatives (a) of using detectors responsive to wavelengths in the 3.0 to 5.0 micron range, which require less cooling, or (b) of using detectors responsive to wavelengths in the 8.0 to 12.0 micron range, which require liquid nitrogen cooling. The two-dimensional detector array may be combined with a limited scanning, called "nutation", which causes each detector to view a plurality of pixels in the incoming infrared radiation.

2 Claims, 8 Drawing Sheets $$R = \frac{1}{f_{CLK} C}$$

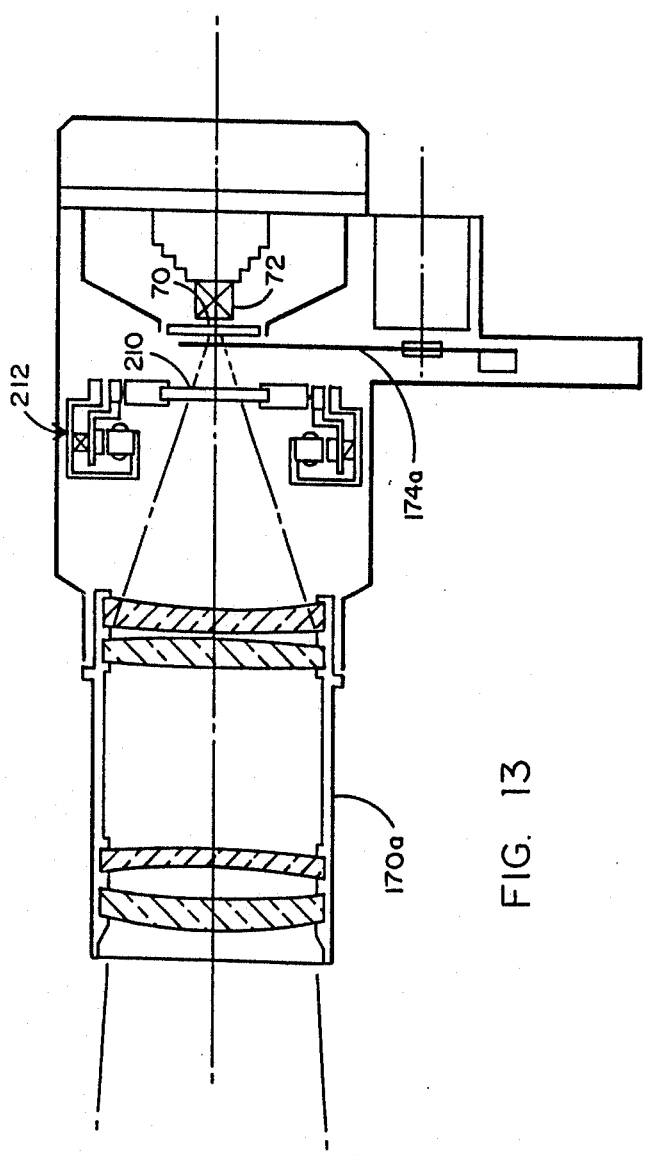
FIG. 13
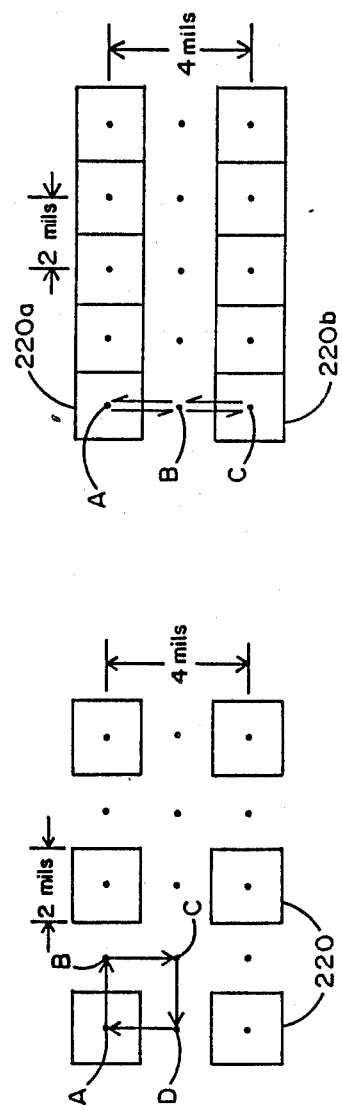
FIG. 15
FIG. 14

THERMAL IMAGER INCORPORATING ELECTRONICS MODULE HAVING FOCAL PLANE SENSOR MOSAIC

This application is a continuation-in-part of application Ser. No. 721,040, filed Apr. 8, 1985 now abandoned.

BACKGROUND OF THE INVENTION

This invention relates to the field of thermal imaging apparatus, in which infrared radiation is converted into a picture accessible to the user of the apparatus.

One major field of use of the invention is in forward looking infrared (FLIR) systems, which are primarily used for night vision. Prior art systems, referred to as Common Module FLIRs, are designed to use infrared detection to permit an operator to, in effect, "see" and identify objects which would otherwise be invisible. Such a system employs a mechanically scanned line array of photoconductive mercury-cadmium-telluride (MCT) detectors cooled to approximately 77° K. The term "common module" refers to the requirement that each major component of the system be replaceable by an equivalent module.

In the "Preliminary Common Module Design Handbook" published by Magnavox, the following common module FLIR elements are listed: (1) Detector, comprising an array of 180 vertically oriented elements of Mercury Cadmium Telluride (HgCdTe); (2) IR (infrared) Imager, which directs infrared inputs toward the detector; (3) Scanner, which is a mechanically oscillating mirror sequentially directing infrared inputs onto the linear detector array; (4) Scan and Interlace Electronics, which provides mirror motion drive; (5) Cooler, which maintains the detectors at approximately 77° K.; (6) Preamplifiers, which provide a 70 to 1 amplification of the electronic output signals of the detectors; (7) Post Amplifiers, which further amplify the detector output signals; (8) LED Display, which converts the amplified detector output signals into visible light, which is collimated by a Visual Collimator module and returned to the reflecting back surface of the scan mirror; and (9) Image Intensifier, which receives the scanned LED display output, intensifies it, and directs it to a bicular eyepiece.

The complexity and costliness of the present FLIR systems is apparent from the extensive number of major components. Also, they have significant performance limitations.

The present invention is intended to significantly reduce the cost and improve the performance of thermal imaging apparatus.

SUMMARY OF THE INVENTION

The present invention obtains its cost and performance advantages over prior art apparatus by using; (a) a two-dimensional array of staring detectors in a Z-technology package; combined with (b) signal chopping and/or scanning means which creates a relatively high signal frequency and avoids the problem of excessive signal degradation due to 1/f noise by removing the low frequency noise from the detector signals. The bandpass filters necessary to separate the high signal frequency from the low noise frequencies are only possible in a Z-technology package because of the filters' physical size. The high frequency back and forth change from calibration signal to detector signal requires a wide dynamic range in the post-detector electronics, which also can only be accomplished by the Z-technology package.

Because of the efficiency of this combination, it is possible to use relatively inexpensive photo-conductive detector material, e.g., lead salts, such as lead selenide (PbSe), which has heretofore been considered to have inadequate performance for use in thermal imaging systems. In addition to the inherent cost advantages of the detector material, its use requires much less costly and bulky cooling equipment than the detector material used in prior art apparatus. In addition to the 1/f noise problem, another deficiency in the lower cost detector material has been its relatively low signal output. This problem, it has been discovered, can be overcome by the use of Z-technology electronics, i.e., electronics located at the focal plane which accomplish signal amplification, filtering and multiplexing before the signals are transmitted to external locations.

BRIEF DESCRIPTION OF THE DRAWINGS

FIG. 13 shows a different embodiment of an optical intake system in which the nutation is accomplished by a refracting element rather than a reflecting element; and FIGS. 14 and 15 show two possible scanning patterns which might be used in nutator scanning, including a pattern in which the same radiation is directed to more than one detector, for comparison and calibration purposes.

DETAILED DESCRIPTION OF SPECIFIC EMBODIMENTS

Figure 1:
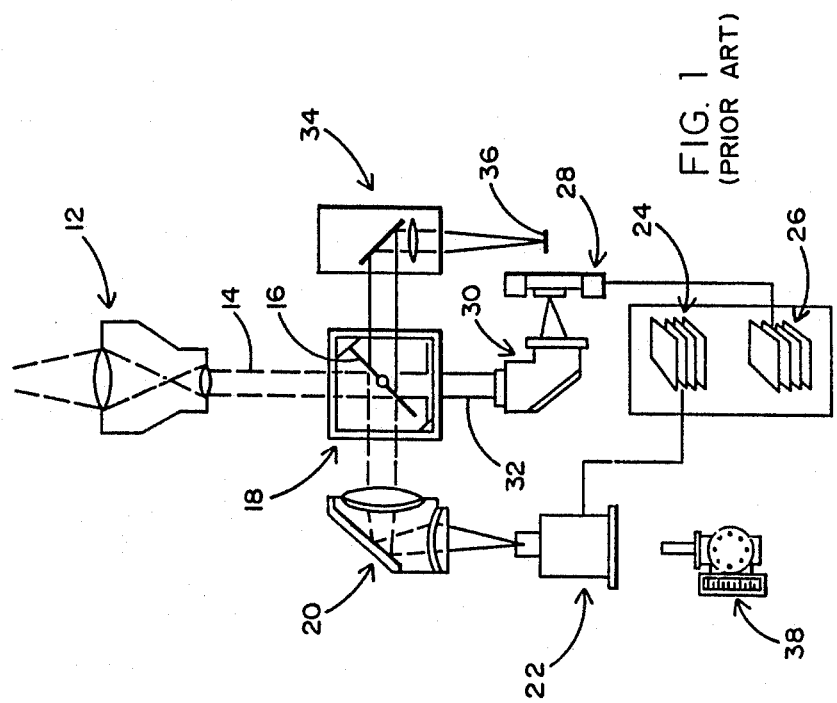
FIG. 1 is a diagrammatic showing of a prior art Common Modular FLIR System.

FIG. 1 shows a typical Common Modular FLIR system of the line array type. Thermal (IR) radiation from the viewed scene is received by an optical module 12, having an afocal magnifying lens. A collimated beam 14 from module 12 impinges on a mirror 16 incorporated in a scanner module 18. Mirror 16 reflects IR energy to an imaging module 20, which focuses it on a detector module 22. The detector comprises a vertically-oriented line array of detector elements, which are formed of mercury cadmium telluride (HgCdTe, hereafter "MCT").

Because a line array detector module is used, it is necessary to scan across the viewed scene, in order to cause energy from successive segments of the scene to impinge seriatim on the detectors. This is accomplished by causing oscillation of mirror 16 about its axis. The mirror is driven, by a suitable motor, through a scan angle up to 10° (5° to each side of center).

The electronic signals output by the scanned detector array 22 are directed first to a pre-amplifier module 24, and then to a post-amplifier module 26. The amplified signals are then conducted to an LED module 28, which has an LED element corresponding to each detector element. Visible light from the LED module is collimated by a visual collimator module 30; and the collimated beam 32 is passed to the back of scan mirror 16 (which also is a reflecting surface).

The scanning movement of mirror 16 causes the visible light to image a visual representation of the infrared scene on the face of a light intensifier module 34, which permits viewing by an observer through a biocular eye-piece 36.

An important and expensive module is the cooler, which is indicated at 38. The MCT detectors need to be cooled to approximately 77° K. Only the detectors are cooled; the electronics are all in a relatively "warm" environment.

The present application discloses a thermal imaging system in which: (a) a two-dimensional array of detectors is used instead of a line array; (b) the detector array is on one surface of a Z-type module which contains electronics for pre-amplifying, filtering and multiplexing the detector output signals, all located in the cooler; and (c) chopping and/or scanning means are incorporated between the detector array and the viewed scene, in order to provide a relatively high-frequency detector signal output.

Other thermal imaging systems are being developed having two-dimensional detector arrays, rather than a scanned linear array. As pointed out in a descriptive paper: "Staring arrays are being considered for many of the next generation IR systems because of the potential of increased performance with less mechanical complexity. Longer integration time of staring arrays offers a sensitivity increase when compared to scanned systems. Elimination of mechanical scanning gives size, cost and reliability advantages to staring arrays. This is especially true in missile seekers with size constraints. These advantages also apply to threat detection applications in which many arrays are required to continuously cover the total 4 steradians field of regard."

Except for the present invention, the proposed two-dimensional arrays of staring detectors for thermal imaging systems are planar arrays, either hybrid or monolithic, which rely on non-focal-plane electronics, i.e., the detector output signals are conducted to electronic processing circuitry located away from the detector plane. The advantages of the present invention over planar array systems will be discussed in detail below.

Figure 2:
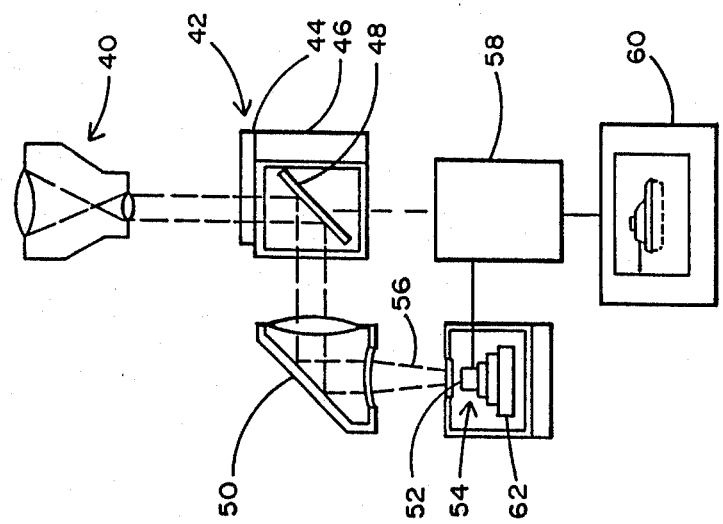
FIG. 2 is a diagrammatic showing of the present invention, in which applicants' detector module replaces several of the components in the prior art system.

FIG. 2 shows a plan view diagram of one embodiment of a FLIR system incorporating the present invention. An optical module 40 directs a collimated IR beam to a module 42, which includes a chopper assembly 44 driven by motor 46, and a fixed (non-scanning) mirror 48. The collimated beam is reflected by mirror 48 to an imaging module 50.

The incoming IR energy is directed by imaging module 50 to a two-dimensional detector array on the focal plane 52 of a detector/electronics module 54. The IR beam 56, which impinges on focal plane 52, covers the entire area of the focal plane (instead of being focused on a single detector, as in the system of FIG. 1). The detector array may include any desired number of detectors, an array of 128×128 being an exemplary choice.

The detector/electronics module 54 includes electronics for independently pre-amplifying and filtering the electronic information from each detector, and then multiplexing the detector signals. This multiplexed output is conducted to a video signal generator 58, whose output is conducted to a video display 60.

The detector/electronics module 54 may be mounted in a cooler 62, if efficient detector operation requires cooling. A major advantage of the present invention is its capability of providing substantial electronic processing at the focal plane (inside the cooler). As will be explained in detail below, this is possible because of the unusually low power dissipation of the electronic circuitry in module 54.

It is apparent that the system of FIG. 2 has substantially simplified the system of FIG. 1. However, the present invention permits much further simplification, as is evidenced in FIG. 3. The system of FIG. 2 was designed for maximum compatibility with the Common Module FLIRs which are currently in widespread use.

Figure 3:
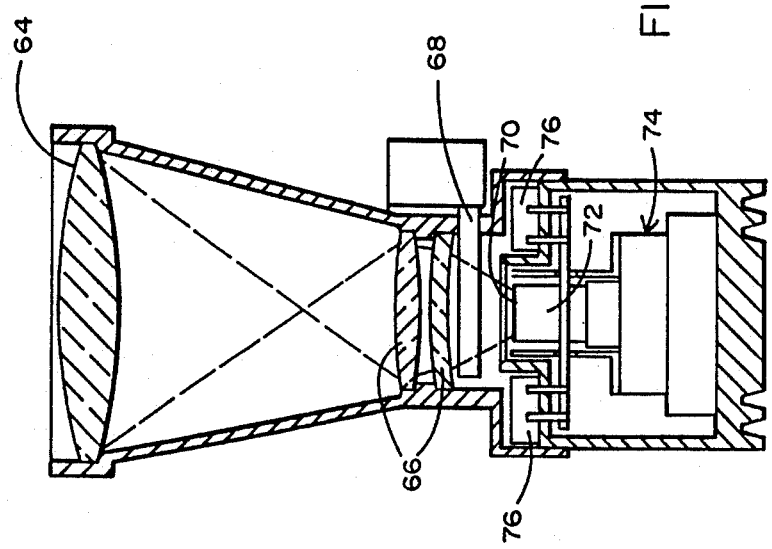
FIG. 3 is a partly-sectional showing of a much simplified radiation input portion of the system of FIG. 2.

In the system of FIG. 3, IR energy from the viewed scene is received by lens 64, and directed through suitable optics 66 and a chopper 68 to a two-dimensional focal plane 70 on a detector/electronics module 72. The module 72 is supported in a multi-stage thermoelectric cooler 74, and has its electronic output signals conducted to a video signal generator via connectors 76.

The purpose of chopper 44 in FIG. 2 and of chopper 68 in FIG. 3 is to provide a DC reference value against which the detector signals are compared; i.e., the choppers are needed to briefly cut off the radiation from the viewed scene and to look, instead, at a surface which provides information for calibration purposes. This calibration function in the prior art scanning FLIR of FIG. 1 is accomplished by continuing the scanning sweep past the edges of the viewed scene. Another valuable effect of the chopper function is that it provides a relatively high frequency signal from the detectors. This high frequency signal greatly diminishes the 1/f noise of the detectors, thus making feasible the use of loewr cost, easier-to-handle detectors.

The chopper-produced a.c. signal requires a very high dynamic range in the post detector electronics. The voltage swing in the signal output is increased by at least two orders of magnitude. Heretofore, this dynamic range requirement has prevented the use of a two-dimensional detector array. In U.S. Pat. No. 3,808,435, which relates to infrared detector systems, it is acknowledged that a rapid change in intensity at the detectors "though potentially very useful, cannot readily be extended to a two-dimensional image" (Col. 5, lines 48–50). However, the present invention is able to accommodate the required dynamic range because of the incorporation of the detector/electronics module 72.

Figure 4:
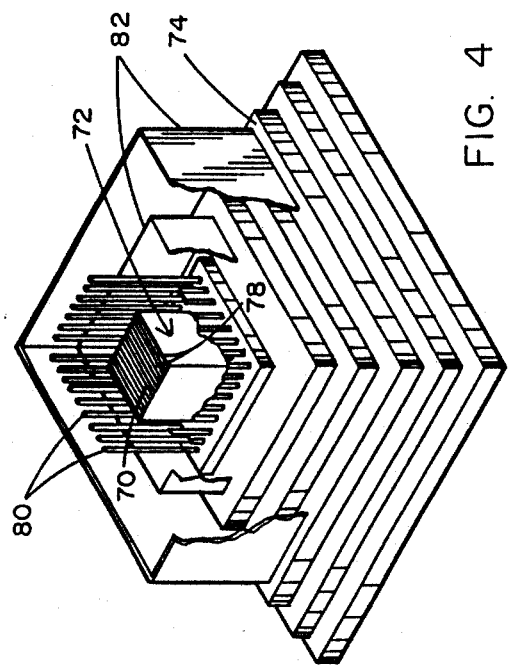
FIG. 4 is an isometric close-up of the detector module and its cooling structure used in FIGS. 2 and 3.

FIG. 4 shows an enlarged isometric view of the cooler 74 and the detector/electronics module 72. The focal plane 70, which may, for example, contain an array of 128×128 detectors, is one surface of module 72, which comprises a multiplicity of layers 78 extending in planes perpendicular to focal plane 70. These layers each carry electronic circuitry, which will be detailed below. A plurality of leads 80 are provided, which are electrically connected to the bottom, or back plane, of module 72, for the purpose of inputting control signals to the module, and outputting detector-initiated signals from the module. The module is mounted atop the cooling platform of multi-stage thermoelectric cooler 74, and is further protected from heat by radiation shields 82, which are cooled by the cooler 74, and which prevent spurious energy from reaching module 72.

Figures 5, 6:
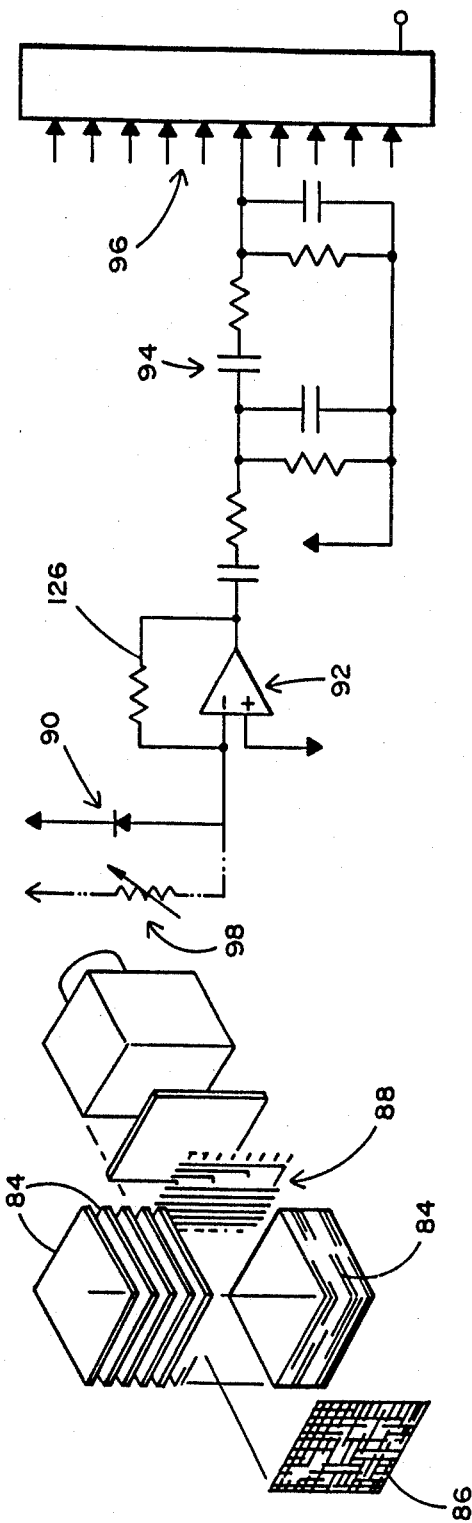
FIG. 5 is a partly exploded isometric view of the stacked circuit-carrying layers which constitute the detector module.
FIG. 6 is an electronic block diagram of the layer-carried circuitry associated with each detector mounted on the module.

The three-dimensional detector/electronics modules 54 in FIG. 2, and 72 in FIG. 3, may be similar to those disclosed in U.S. Pat. No. 4,551,629, issued Nov. 5, 1985, assigned to the assignee of this application. As shown in FIG. 5, such a module comprises a stack of thin layers 84, each carrying circuitry which performs preamplifying, filtering and multiplexing functions on the individual photo-detector output signals. Preferably the layers 84 are semiconductor chips having integrated circuits (IC) formed thereon. The chips are secured together to form the module, and each has a large number of closely spaced electrical leads at the focal plane, which has an array of detectors 86. Each detector is independently in electrical contact with one of the closely spaced electrical leads provided by the circuitry on the chips.

Backplane wiring 88 is used to connect the circuitry on the stacked chips with the external electrical leads 80 (FIG. 4).

The three-dimensional detector/electronics packages are generally referred to as Z-type modules, because, in addition to the X and Y dimensions of the two-dimensional focal plane detector array, they incorporate a Z, or depth, dimension which contains extensive electronic circuitry.

FIG. 6 exemplifies the general layout of circuitry connected to each detector. If a two-dimensional array of 128×128 detectors is used, each chip (or layer) 84 will carry 128 such circuits, and 128 chips (or layers) 84 will be stacked and bonded together. As shown, each detector 90 has its output connected to a preamplifier 92. Each preamplifier feeds its output signal to an individual adaptive bandpass filter 94, which selects the desired band of frequencies to be processed. The post-filter signal is input to a multiplexer 96, which comprises parallel input branches from each of the separate detector circuits, and a control circuit which causes sequencing of the multiplexed output signals conducted off the chip.

The preamplifier 92 may be similar to that disclosed and claimed in common assignee U.S. Pat. No. 4,555,623, issued Nov. 26, 1985; and the multiplexer 96 may be similar to that disclosed and claimed in common assignee U.S. Pat. No. 4,490,626, issued Dec. 25, 1984. The circuit of FIG. 6 is designed for the use of photovoltaic detectors. If photo-conductive detectors are used, an exterior current source 98 (shown in phantom) is included.

All of the "focal plane" circuitry, i.e., comprising the separate preamplifiers, separate filters and multiplexing circuitry, is located inside the cooled container, the reduced temperature of which is required for detector effectiveness.

The transistors used in the focal plane circuitry located on the stacked chips are preferably MOSFETS, because of their ability to operate under cryogenic conditions, and because of major advantages which they bring to the problems addressed in developing suitable "on-focal-plane" circuitry. A fundamental problem is the requirement for low power operation, because power dissipation must be minimal.

As a means of minimizing power dissipation, the preamplifier 92 may be operated in the "weak inversion" mode (also referred to as "sub-threshold" or "current-starved"). The importance of this functional aspect is discussed in detail in U.S. Pat. No. 4,555,623. In that patent, it is explained that the disclosed preamplifier—an operational amplifier held in the weak inversion range—meets the severe requirements, including space limitations, low power limitations, high gain requirements, and variable gain adjustability. The disclosure of that patent is incorporated by reference in the present description.

Figure 7:
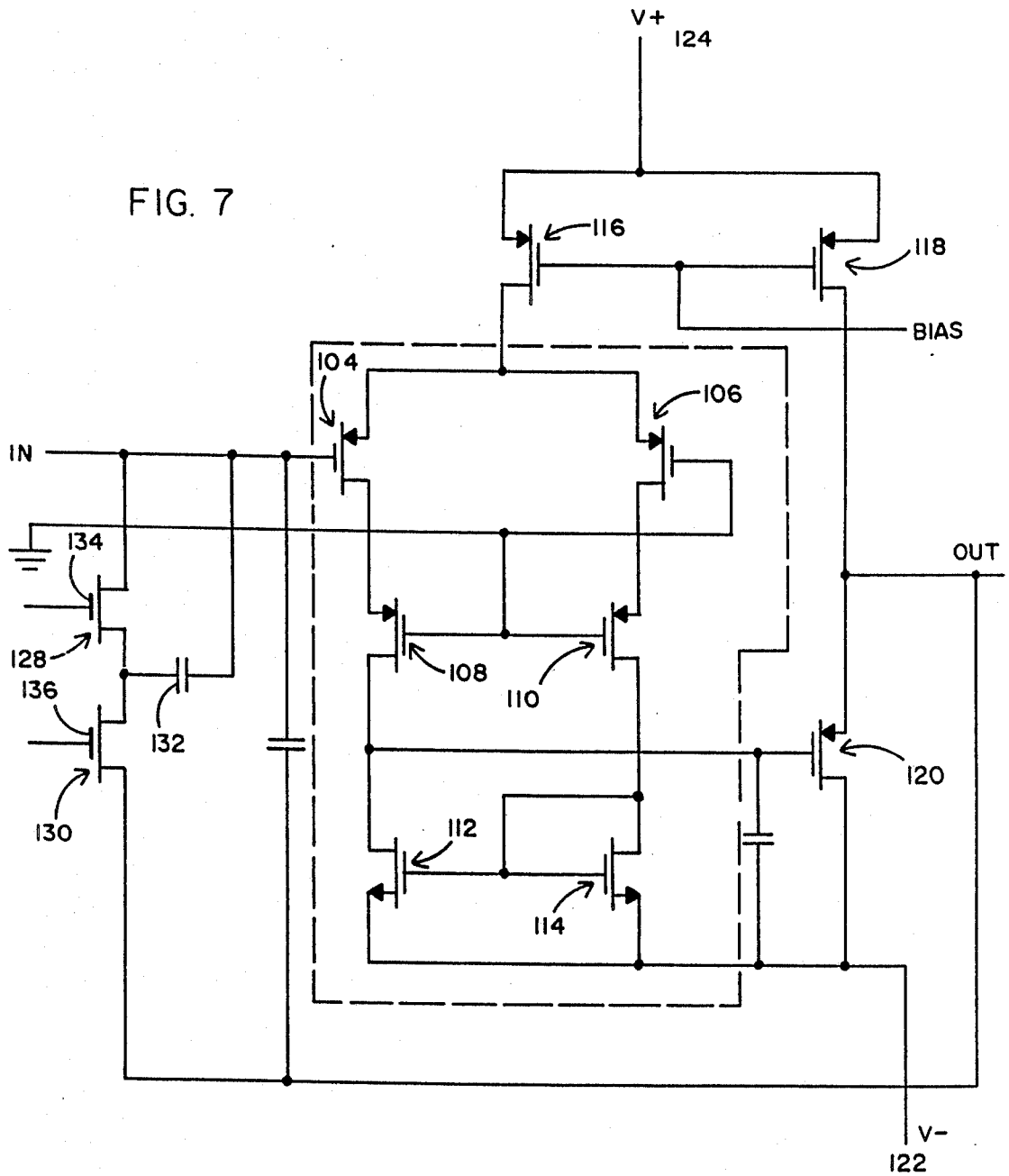
FIG. 7 is a schematic of a preamplifier circuit suitable for the circuitry of FIG. 6.

FIG. 7 corresponds to FIG. 2 of U.S. Pat. No. 4,555,623 but its description omits much of the specific description included in the prior patent. In FIG. 7, the pre-amplifier has a differential amplifier portion comprising six MOSFET transistors: a differential pair 104 and 106; a cascode pair 108 and 110; and a current mirror pair 112 and 114. Transistor 104 has its gate connected to the detector signal; and its matched transistor 106 has its gate connected to ground.

The sources of transistors 104 and 106 are both connected to a constant current source 116. Another constant current source 118 supplies current to a source follower transistor 120, which provides the output signal from the preamplifier to the filter 94. The source follower transistor 120 has its source-to-drain current flowing between the constant current source 118 and the negative bias voltage 122. The positive bias voltage 124 is applied at one side of the two constant current sources 116 and 118.

The feedback resistance of the operational amplifier, which is shown diagrammatically at 126 in FIG. 6, is preferably provided by a switched capacitance network (as shown in FIG. 7), which comprises MOSFET switching transistors 128 and 130, capacitor 132, and clock-controlled inputs at gates 134 and 136. By changing the frequency of the switching network, the equivalent resistance value can be varied for optimal results. In other words, the preamplifier gain is variable on a real time basis.

Figures 8, 9:
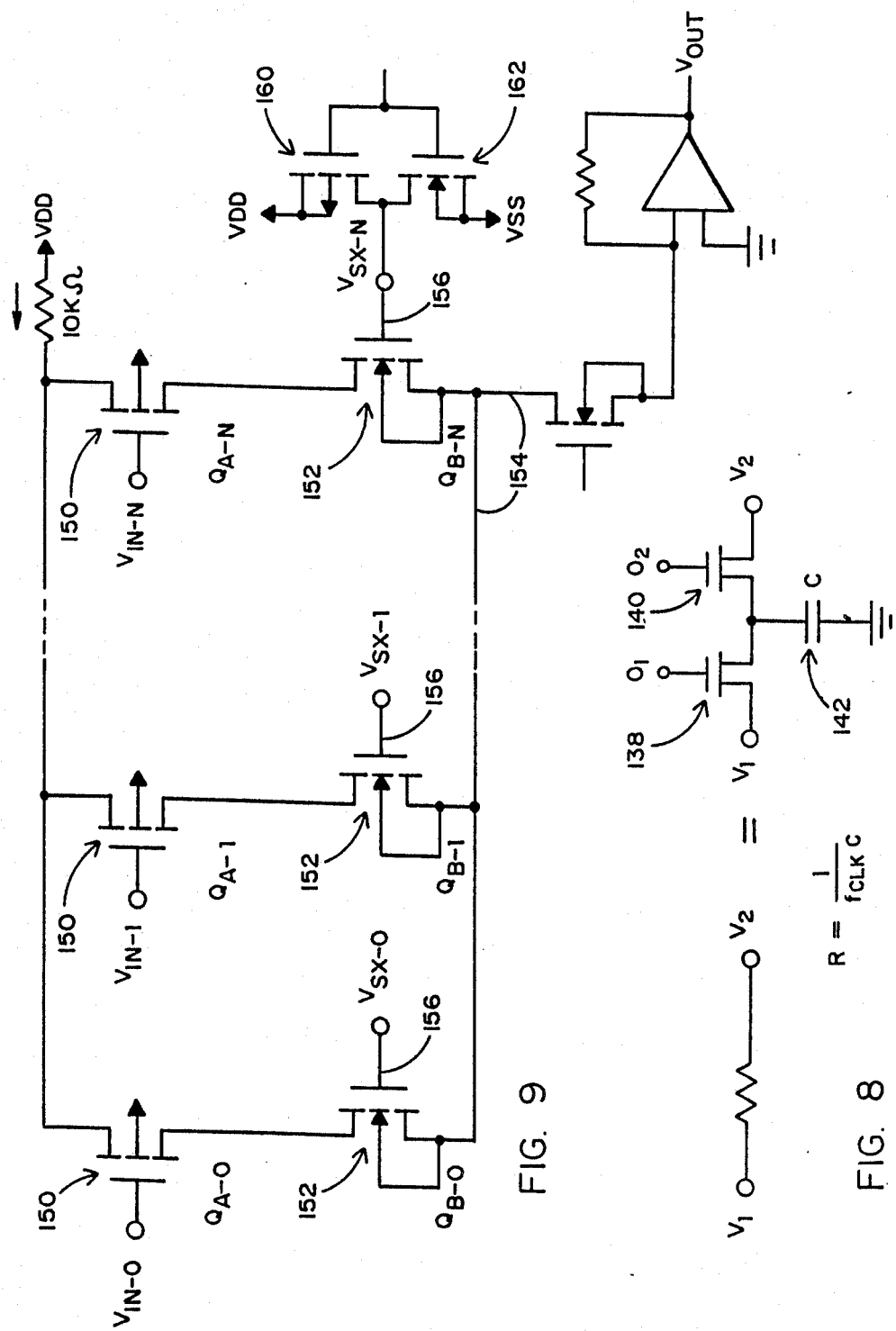
FIG. 8 is a schematic illustration of the switched capacitance network used as a resistance-equivalent in the adaptive bandpass filter of FIG. 6.
FIG. 9 is a schematic of a multiplexer circuit suitable for the circuitry of FIG. 6.

The amplified signal from each detector is fed into the adaptive bandpass filter 94, where the output signal is limited to the desired range of frequencies. The filter 94 couples the detector to the multiplexer and performs the functions of 1/f noise rejection and real time clutter rejection, which is very important in preventing unwanted extraneous signals from entering the multiplexer, and thus from entering subsequent post-processing circuitry, where they must be removed by a more complicated process. The bandpass filter is implemented by using switched capacitors in place of resistive elements. FIG. 8 shows an individual resistance-equivalent switched capacitance network comprising two MOSFET transistors 138 and 140, which acts as frequency-controlled switches, and a capacitor 142. Use in the filter of CMOS switching elements, which are compatible with the other on-chip transistors, simplifies filter fabrication and provides a high degree of uniformity from one filter to another, since the equivalent resistance value is dependent on the size of the capacitors. MOSFET capacitors will vary due to geometry differences, but these can be held to a very tight tolerance. A second advantage of switched-capacitor implementation is that, by adjusting the clock frequency, the equivalent resistor can be altered in value. This principle allows the bandpass filter to be varied in frequency by adjusting the clocking rate of the switches.

The third, and final, on-chip segment of electronic circuitry is the multiplexer. FIG. 9, which shows a desirable multiplexer circuit, is substantially identical to FIG. 3 of U.S. Pat. No. 4,490,626. Because the multiplexer circuit is discussed in detail in that patent, that disclosure is incorporated herein by reference, and the description of the circuit here will be relatively brief.

FIG. 9 shows three parallel branches of the multiplexer, each of which contains two MOSFET transistors. A MOSFET 150 in each branch is an amplifier of the analog signal from its respective detector. A MOSFET 152 in each branch acts as a switch which, when enabled, connects the MOSFET 150 in the same branch to a multiplexer output line 154.

Each MOSFET 150 receives at its gate the analog voltage signal originating from its respective detector. Significantly, its output analog signal is the source-to-drain current flow, which varies proportionally to the input voltage, the source of each MOSFET 150 being connected to the common source voltage, and the drain of each MOSFET 150 being connected to the drain of the respective switch MOSFET 152.

Each switch MOSFET 152 has its gate connected to its respective line 156 from the logic circuit; and its source connected to the common multiplexer output line 154. Under the control of the logic circuit, the switch MOSFETs 152 are normally disabled, allowing no current flow through the respective amplifier MOSFETs 150. When a "trigger in" signal is received by the logic circuit, it first sends a voltage signal on the line 156 designated V(SX-O), causing the switch MOSFET 152 designated Q(B-O) to turn on. A current analog output signal is thereupon permitted to flow in the amplifier 150 designated Q(A-O), which signal is proportional to, but amplified to a much higher power than, the input signal designated V(IN-O); and the amplified current output signal from Q(A-O) is transmitted through switch Q(B-O) to the multiplexer output line.

The logic circuit then turns off the signal on the line V(SX-O), and sends a voltage signal on the next line designated V(SX-1) to turn on the next switch 152 designated Q(B-1). This permits an amplified analog current signal to flow in the amplifier 150 designated Q(A-1), in the same branch as switch Q(B-A); and permits that signal to pass to the multiplexer output line. This process is continued until all detector-amplifier combinations have sent their output signals in the desired order to the output line.

Each switch 152 may be controlled by a typical CMOS switch in the logic system, one of which is shown at the right side of FIG. 9 connected to V(SX-N). Each CMOS logic switch comprises a P-channel MOSFET 160 having its source connected to V(DD), and an N-channel MOSFET 162 having its source connected to V(SS). [Values of the source voltages may be approximately 5V at V(DD) and approximately OV at V(SS)]. The gates of the respective MOSFETs 160 and 162 are both connected to the logic circuitry; and the drains of the respective MOSFETs 160 and 162 are both connected to the gate of one of the switch MOSFETs 152.

As explained in U.S. Pat. No. 4,490,626, the multiplexer circuitry has important benefits, including (a) minimal power dissipation because no current flows in either transistor of a disabled branch, and (b) minimal cross-talk between branches because analog current signal are output instead of analog voltage signals.

The use in a thermal imaging system of the stacked chips, which have substantial electronic circuitry located at the focal plane, and which are located inside the cooling element, provides important synergistic effects. It makes detector performance much less critical, because electronics gain reduces the "work" required from the detectors. The focal plane pre-amplifier allows each detector to have the desired DC bias voltage, which is both "low" and very stable. Filtering and multiplexing at the focal plane complete the electronic processing, which is important to accomplish before the signals are routed to external circuitry. In other words, the number of leads exiting the module 72 is minimized; but all processing needed on each separate detector signal has been accomplished prior to multiplexing.

Because the amplifying, filtering and multiplexing circuitry is in the module which provides the two-dimensional detector array, the system provides the dynamic range required by the a.c. signal which is created by the chopping and/or scanning of the optical input received by the detectors.

Another advantage is the availability of random access readout, which is not possible with a line array. This permits the present system to provide a TV-display output with much simpler electronics. The common modular FLIR system requires very complicated reformatting if a TV-display output is required.

Heretofore, Common Modular FLIR systems have been designed for operation in the spectral band from 8.0 to 12.0 microns, using MCT detectors in the photoconductive mode. These expensive detector arrays have been considered necessary in prior art apparatus, in order to obtain acceptable performance.

Probably the most significant benefit of the present invention is that it provides good performance with detectors which are much less expensive than those required by the prior art. And it also allows the detectors to perform without the extreme cooling requirements (and bulky cooling apparatus) of prior art systems.

It has generally been assumed that lead selenide detector material would not satisfy FLIR requirements. Such detectors tend to have high 1/f noise and low signal output.

In order to overcome these limitations of lead selenide detectors, the present invention (a) reduces the 1/f noise by tuning the signal frequencies up to higher values; and (b) compensates for the lower inherent sensitivity (signal-to-noise ratio) of the detectors.

The advantages of the present system can be used to permit incorporation of lower performance detectors, greatly reducing cost, without sacrificing system performance. The primary source of cost reduction is eliminating the need for the extreme cooling required by MCT detectors. For example, with the present system, it is feasible to use lead selenide (PbSe) detectors, operating in the 3.0 to 5.0 micron wavelength range, which require cooling only to 200° K. MCT detectors require cooling to 77° K., which necessitates the use of liquid nitrogen. Liquid nitrogen coolers are expensive, heavy, hard to maintain, and have high power requirements which need heavy battery packs having limited operating time between replacements.

As previously stated, the use of a two-dimensional array offers a major sensitivity improvement over a scanned line array, because of the longer integration time. The quantitative benefit is approximately the square root of the ratio of the numbers of detectors in the respective arrays. For example, in comparing a two-dimensional array of 128×128 detectors to a line array of 128 detectors, the ratio of the number of detectors in the former to the number of detectors in the latter is 128 to 1. The performance gain of the two-dimensional array is approximately respresented by the square root of 128. So the improvement is greater than an order of magnitude.

Use of the Z-technology, which provides high signal gain at the focal plane, overcomes the problems due to the inherent low efficiency of the photo-conductive lead selenide detectors.

Use of chopping or scanning to provide high frequency signals is also necessary, in order to minimize the effect of 1/f noise in the lead selenide detectors. While this problem does not exist in the scanning, line array prior art apparatus, the absence of the two-dimensional array in such apparatus results in a much lower sensitivity, as discussed above.

Obtaining the very substantial advantages of low cost detectors thus requires: (a) a two-dimensional detector array, (b) Z-technology to provide focal plane signal gain and multiplexing, and (c) chopping or scanning the incoming radiation to provide high frequency signals for 1/f noise avoidance.

Combining these concepts has resulted in successful use of low cost detector materials heretofore rejected by those working in the thermal imaging field.

One potential limitation of the present invention relates to the fineness of resolution attainable. In modules of the type identified by numerals 54 and 72, the present center-to-center distance between detectors is 0.004 in. In the line array systems, a center spacing of 0.002 in. has been used.

The focal plane faces of modules 54 and 72 can be considered as having an X-axis which is parallel to the planes of the stacked layers 78 (FIG. 4), and a Y-axis which is perpendicular to the planes of the layers. Because the Y-axis spacing of detector leads is controlled by the thickness of the respective layers, it requires extreme manufacturing accuracy and care to reduce the Y-axis center spacing of the leads.

In order to enhance resolution in the present system, a limited amount of scanning may be introduced. For example, by using each detector to view four points, an array of 128×128 detectors on 0.004 in. centers can provide an array of 256×256 pixels on 0.002 in. centers. This compromise sacrifices some of the performance advantage due to the integration effect of staring sensors, and also some of the advantage of eliminating mechanical scanning. However, there remains a substantial performance benefit; and the limited scanning can be accomplished by a much simpler, less expensive and more reliable mechanism than that required in line array systems.

Figure 10:
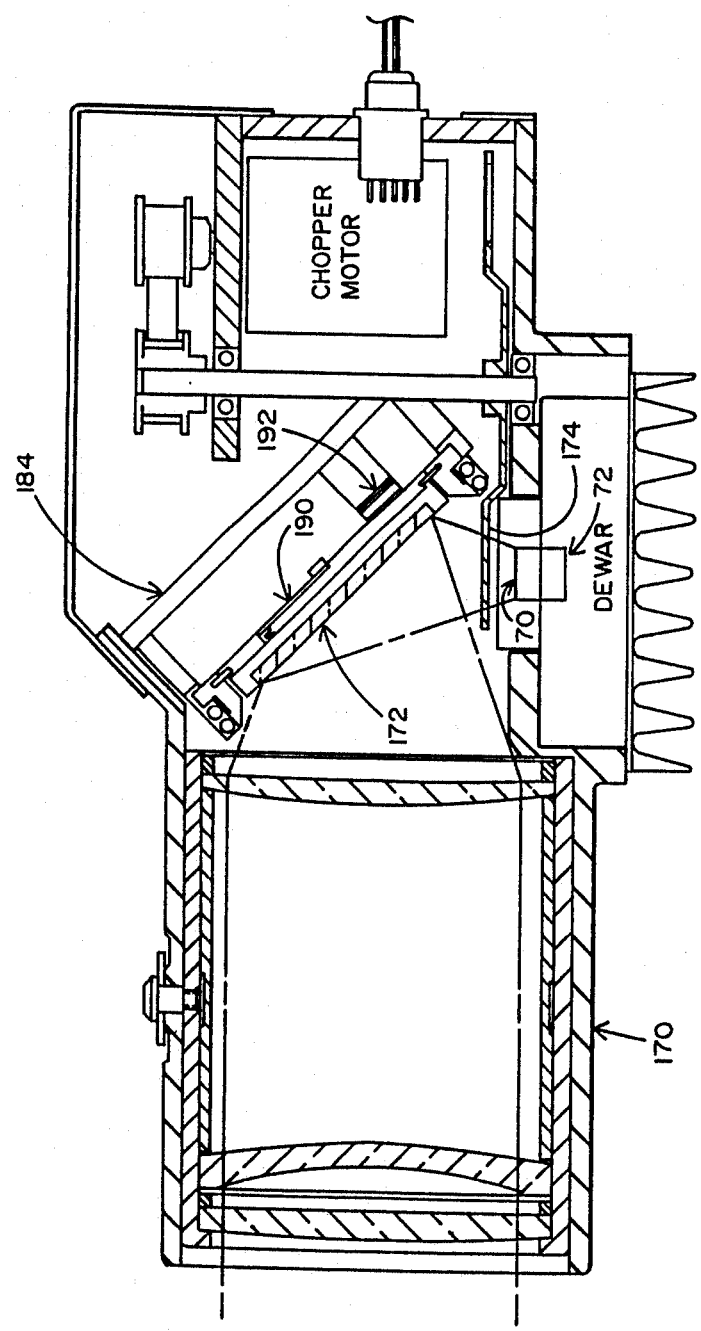
FIG. 10 shows an optical intake system for directing radiation to the detector array, which system includes means (referred to as a "nutator") for causing limited scanning motion of the radiation directed to each detector.

FIG. 10 illustrates a limited scanning feature, which is referred to as "nutation", incorporated in the system of the present invention. Incoming radiation from the viewed scene (at left in the figure) passes through an optical module 170, and is reflected toward the detector/electronics module 72 by a mirror 172. A chopper blade 174 is caused to rotate across the path of radiation focused on the detector focal plane 70 of module 72. The mirror 172 is so arranged that it has a limited scanning motion. For this purpose it may be pivotally movable (for very small distances) about two pivot axes, which are at right angles to one another. It is desired to have the mirror move in sequence to a plurality of fixed positions; and spend as much time as possible in a "staring" mode in each of those positions. If each cycle of motion of the mirror has four fixed data integrating positions, the portion of time available for data-integration is about seven-eights of the time cycle. In other words, if the time cycle of nutation from starting point back to starting point is assumed to be 33 ms., the total motion time required (which is not available for detector sensing input) is approximately 4 ms., leaving 29 ms. for detector sensing input.

Figure 12A:
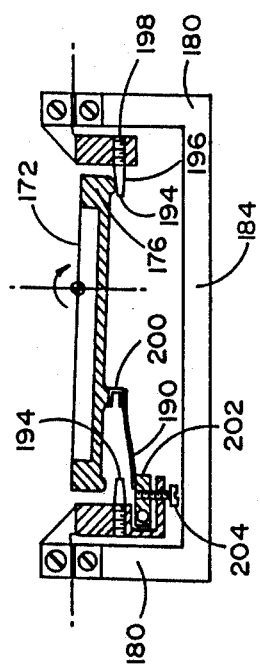
FIGS. 12A and 12B are cross-sections taken through the structure of FIG. 11 along the two pivot axes of the nutating mirror.
Figure 12B:
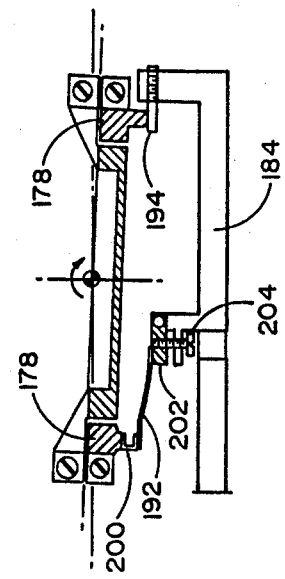
Figure 11:
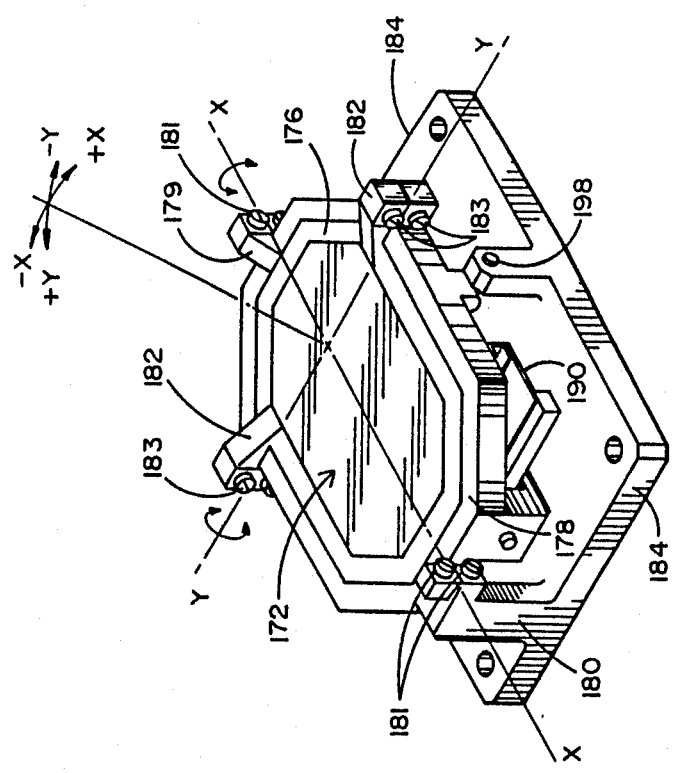
FIG. 11 is an isometric view showing the nutating mirror element of FIG. 10.

FIGS. 11, 12A and 12B show a structure suitable for causing nutating motion of mirror 172. The mirror is pivotally movable both on axis X—X and on axis Y—Y. It is carried by an inner gimbal ring 176, which is pivoted on the Y-axis (as shown in FIG. 12A), and which in turn is carried by an outer gimbal ring 178. The outer gimbal ring 178 is pivoted on the X-axis (as shown in FIG. 12B). The outer gimbal ring 178 has arms 179 at opposite ends of the X-axis, each of which is connected to a supporting element 180 by a pair of flex pivots 181. The inner gimbal ring 176 has arms 182 at opposite ends of the Y-axis, each of which is connected to the outer gimbal ring 178 by a pair of flex pivots 183. The supporting elements 180 are carried by a mounting plate 184 which is retained in a fixed position in the structure of FIG. 10, thereby locating the entire nutator sub-assembly in the desired position.

As shown in both FIGS. 12A and 12B, a preferred means of causing pivotal motion of mirror 172 is a piezo-electric element, which acts as a voltage-to-pressure transducer. Such a piezo-electric element is shown at 190 in FIG. 12A and at 192 in FIG. 12B. Applying a direct electric field across either of the piezo-electric elements 190 or 192 causes it to flex in one direction or the other, depending on the polarity of the electric field. When voltage of one polarity is applied to piezo-electric element 190 (FIG. 12A), it moves the inner gimbal ring 176 into engagement with a stop member 194, which has a tapered engaging portion 196 at the end of a threaded portion 198, thus permitting adjustment of the stop-engaging position of the mirror. A similar stop member 194 is located at the opposite end of the inner gimbal ring 176, and is engaged by ring 176 when the polarity of the voltage across piezo-electric element 190 is reversed, causing element 190 to flex in the opposite direction. The total motion caused by flexure of the element 190 is only about 1 mil.

One end of element 190 is secured to the inner gimbal ring 176 by a bracket 200, and its other end is secured to a pivoted arm 202, the position of which may be adjusted by a screw 204, thereby equalizing the flexing motion required in opposite directions.

As shown in FIG. 12B, the same arrangement may be used in controlling the pivotal movement of the outer gimbal ring 178, moving it either into engagement with the stop member 194 at the right side of the gimbal ring, or into engagement with a stop member (not shown) at the left side of the gimbal ring.

Since each of the gimbal rings 176 and 178 has two alternating stop-engaging positions, the mirror 172 has four fixed signal-viewing positions. By using a single detector to sense radiation from four positions, the available number of pixels per detector has been quadrupled. This has been accomplished with a very slight amount of accurately-controllable scanning motion of the mirror.

FIG. 13 shows another means of causing the nutation scanning effect. Whereas FIGS. 10–12 use a reflecting mirror as the scanning element, the structure shown in FIG. 13 uses a refractive element, which is a prism 210. Its motion may be caused by an annular electric motor 212 moving a cam to cause sequential relocation of the element 210 at each of the desired positions. The length of motion required by a refractive nutating prism is greater than that required by the mirror of FIGS. 10–12; therefore, the piezo-electric elements are not considered suitable for the mechanical nutator of FIG. 13. FIG. 13 shows an optical module 170a, a chopper 174a, and the detector focal plane 70 on the surface of optical/electronic module 72, which is mounted inside a cooling unit.

Using the limiting scanning motion, which has been referred to as "nutation", provides innumerable possibilities for performance enhancement of the thermal imager system. FIGS. 14 and 15 illustrate diagrammatically just two of the possibilities.

In FIG. 14, it is assumed that each of a plurality of detectors 220 extends 2 mils in each direction, and that the detector centers are spaced 4 mils apart in both the X-axis (horizontal) and Y-axis (vertical). Although the detectors are stationary during nutation, while the scene viewed by each detector is moved by the nutator, the resulting scan can be diagrammatically illustrated by plotting imaginary detector movement. FIG. 14 illustrates the use of four spaced samples per frame. The pixel center is assumed to start by viewing at point A, first move on X-axis to view at point B, then move on Y-axis to view at point C, then move on X-axis to view at point D, and finally move on Y-axis back to view at point A. This sequence is repeated continuously. The result is that detectors having center-to-center spacings of 4 mils can provide center-to-center pixel resolution of 2 mils. Assuming the square root of 128 as the sensitivity (performance) advantage of the two-dimensional detector mosaic over the line array, the nutation scanning has given up approximately one-half of that advantage, because the frequency bandwidth must be increased by four to allow for four separate frames. This results in a reduction in performance by the square root of four compared to the completely staring case.

FIG. 15 illustrates an interesting possibility, which has several potential advantages. First, it requires nutating motion in one direction only (oscillation), i.e., around one axis. Second, it reduces the number of required stopping points. Third, it causes viewing of a given portion of the scene by more than one detector, thereby enhancing uniformity; i.e., relative detector outputs, or gains, can be electronically adjusted to provide uniform detector response. Fourth, it is particularly compatible with the stacked layer construction of module 72, because it provides increased resolution in one axis. The latter advantage refers to the fact that it is much easier to reduce center-to-center detector spacing along the X-axis, where the electrical leads lie along a single layer surface, than to reduce center-to-center detector spacing along the Y-axis, where the electrical leads are separated by the thicknesses of the stacked layers.

FIG. 15 illustrates the use of three samples per frame, one of which involves a second detector. The pixel center is assumed to start by viewing at point A on detector 220a, first move to a second viewing point B, and then move to a third viewing point C on detector 220b. Thereafter, the scanner can be returned to point A for repetition of the sequence. Because each detector 220a and 220b has viewed a common pixel, their outputs can be calibrated and adjusted to improve uniformity. This feature can be expanded by combining more than two detectors in the same frame, without eliminating the advantages of (a) simplified mechanical scanning structure, and (b) increased sensitivity because of available detector "staring" time.

Although optical chopper elements are shown in the embodiments of FIGS. 10 and 13, it would be feasible to eliminate the choppers, because the limited scanning shown in these embodiments can provide the calibration and signal-frequency-generating functions for which the choppers are needed in the embodiments of FIGS. 2 and 3.

From the foregoing description, it will be apparent that the apparatus embodiments disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A thermal imaging unit, for use in detecting objects in an observed area by means of infrared radiation at ambient temperature levels, comprising:
   a staring array of separate photodetectors which are formed of lead selenide material, which substantially fill a two-dimensional focal plane, and which convert incoming infrared radiation into a multiplicity of separate electronic signals;
   the photodetectors operating in the photoconductive mode, and detecting signals in the approximate wavelength range of 3.0 to 5.0 microns;
   a unitary three-dimensional electronics package supporting the photodetector array on one end thereof, and having embedded therein means for first amplifying the separate electronic signals, means for then filtering the separate electronic signals, and means for multiplexing those signals to output the separate photodetector signals serially;
   cooling means for maintaining the photodetectors at a temperature in the vicinity of 200K.;
   optical means for receiving infrared radiation from the observed area, and for directing such radiation toward the staring array of photodetector; and
   signal frequency controlling means between the incident radiation and the photodetectors, such means providing an a.c. signal frequency at the photodetectors much greater than that which the photodetectors would receive in their staring mode.

2. The thermal imaging unit of claim 1 in which the signal frequency controlling means is a scanning device which causes each photodetector to view a plurality of pixels in the incoming infrared radiation.

* * * * *